(12) United States Patent
Raj et al.

(10) Patent No.: US 11,417,561 B2
(45) Date of Patent: *Aug. 16, 2022

(54) EDGE RING FOR A SUBSTRATE PROCESSING CHAMBER

(71) Applicant: Applied Materials, Inc., Santa Clara, CA (US)

(72) Inventors: Govinda Raj, Santa Clara, CA (US); Kadthala Ramaya Narendrnath, San Jose, CA (US); Bopanna Ichettira Vasantha, Bangalore (IN); Simon Yavelberg, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 208 days.

This patent is subject to a terminal disclaimer.

(21) Appl. No.: 16/752,127

(22) Filed: Jan. 24, 2020

(65) Prior Publication Data

US 2020/0161165 A1    May 21, 2020

Related U.S. Application Data

(62) Division of application No. 14/975,119, filed on Dec. 18, 2015, now Pat. No. 10,553,473.

(Continued)

(51) Int. Cl.
*H01L 21/687* (2006.01)
*H01L 21/67* (2006.01)
(Continued)

(52) U.S. Cl.
CPC .... *H01L 21/68735* (2013.01); *C23C 16/4585* (2013.01); *H01L 21/67017* (2013.01);
(Continued)

(58) Field of Classification Search
CPC ......... H01L 21/68735; H01L 21/67098; H01L 21/67017; B33Y 80/00; B33Y 10/00; C23C 16/4585

See application file for complete search history.

(56) References Cited

U.S. PATENT DOCUMENTS 6,106,625 A * 8/2000 Koai ............... C23C 16/455
                                                    118/715
10,553,473 B2 * 2/2020 Raj ................ C23C 16/4585
(Continued)

FOREIGN PATENT DOCUMENTS

CN          1260770 C      6/2006
CN        100375261 C      3/2008
(Continued)

OTHER PUBLICATIONS

Written Opinion of the International Searching Authority for PCT/US2015/062410 dated Feb. 15, 2016 (13 pgs.).

(Continued)

*Primary Examiner* — Jeffrie R Lund
(74) *Attorney, Agent, or Firm* — Patterson + Sheridan LLP

(57) ABSTRACT

An edge ring and process for fabricating an edge ring are disclosed herein. In one embodiment, an edge ring includes an annular body and a plurality of thermal breaks disposed within the annular body. The thermal breaks are disposed perpendicular to a center line of the annular body of the edge ring.

13 Claims, 4 Drawing Sheets

Related U.S. Application Data

(60) Provisional application No. 62/094,490, filed on Dec. 19, 2014.

(51) Int. Cl.
  *C23C 16/458* (2006.01)
  *B33Y 10/00* (2015.01)
  *B33Y 80/00* (2015.01)

(52) U.S. Cl.
  CPC ........ *H01L 21/67098* (2013.01); *B33Y 10/00* (2014.12); *B33Y 80/00* (2014.12)

(56) References Cited

U.S. PATENT DOCUMENTS

| | | |
|---|---|---|
| 2002/0086153 A1 | 7/2002 | O'Donnell et al. |
| 2003/0186563 A1 | 10/2003 | Kobayashi et al. |
| 2004/0261946 A1 | 12/2004 | Endoh et al. |
| 2007/0193688 A1 | 8/2007 | Dhindsa et al. |
| 2008/0149598 A1 | 6/2008 | Hayashi et al. |
| 2008/0236746 A1 | 10/2008 | Oyabu et al. |
| 2008/0239691 A1* | 10/2008 | Miyagawa ........ H01L 21/67005 361/809 |
| 2009/0016855 A1* | 1/2009 | Hofmeister ....... H01L 21/67126 414/220 |
| 2010/0012274 A1 | 1/2010 | Miyagawa et al. |
| 2012/0040097 A1* | 2/2012 | Volf .................... C23C 16/4586 427/255.5 |
| 2012/0168091 A1* | 7/2012 | Kell .................... H01L 21/6838 156/707 |
| 2012/0171809 A1* | 7/2012 | Kell .................... H01L 31/0288 438/96 |
| 2013/0284372 A1* | 10/2013 | Tavassoli .................. B23C 3/13 156/345.29 |
| 2016/0181142 A1* | 6/2016 | Raj .................... H01L 21/67017 156/345.3 |
| 2016/0237879 A1* | 8/2016 | Rowan ................ F02B 19/1009 |
| 2018/0149039 A1* | 5/2018 | Loeffel ................ B23K 26/342 |
| 2018/0236552 A1* | 8/2018 | Basini .................... B33Y 80/00 |
| 2018/0337074 A1* | 11/2018 | Samir ............... H01J 37/32715 |
| 2019/0244848 A1* | 8/2019 | Willwerth ........... H01L 21/6833 |
| 2019/0311933 A1* | 10/2019 | White ................. H01L 21/6833 |

FOREIGN PATENT DOCUMENTS

| | | |
|---|---|---|
| CN | 101389788 A | 3/2009 |
| CN | 100474521 C | 4/2009 |
| CN | 102272344 A | 12/2011 |
| CN | 103718283 A | 4/2014 |
| CN | 104205295 A | 12/2014 |
| JP | H07221024 A | 8/1995 |
| JP | 2002246370 A | 8/2002 |
| JP | 2010150605 A | 7/2010 |
| JP | 5361947 B2 | 12/2013 |
| KR | 20120110060 A | 10/2012 |
| WO | 2013/019358 A1 | 2/2013 |

OTHER PUBLICATIONS

Office Action from Taiwan Application No. 104139466 dated Jun. 26, 2019.
Office Action from Chinese Application No. 201580069444.3 dated Mar. 23, 2020.
Korean Notice of Allowance for Application No. 10-2017-7020279 dated Mar. 2, 2022.

* cited by examiner

EDGE RING FOR A SUBSTRATE PROCESSING CHAMBER

CROSS-REFERENCE TO RELATED APPLICATIONS

This application is a divisional of U.S. application Ser. No. 14/975,119 filed Dec. 18, 2015, which claims priority from U.S. Provisional Application Ser. No. 62/094,490, filed Dec. 19, 2014, each of which is hereby incorporated by reference in its entirety.

BACKGROUND

Field

Embodiments described herein generally relate to an apparatus for fabricating devices on a substrate. More particularly, embodiments described herein provide an edge ring for supporting a substrate in a processing chamber.

Description of the Related Art

In the processing of substrates, such as semiconductor wafers and display panels, a substrate is placed on a support in a processing chamber while suitable processing conditions are maintained in the processing chamber. For example, a substrate can be heated for either a deposition, etch or other semiconductor fabrication process. During a semiconductor fabrication process, a substrate may be supported by a supporting structure while energy from above or below the substrate is utilized to heat the substrate. In many processing chambers, an edge ring is utilized to protect the substrate supporting structure while processing the substrate.

FIG. 1 schematically illustrates a sectional view of a conventional edge ring 100 used in a semiconductor processing chamber. The supporting structure that supports the substrate and edge ring 100 is not shown. The edge ring 100 has an inner diameter slightly smaller than an outer diameter of a substrate 102 being processed. During processing, an outer edge region 106 of the substrate 102 is disposed above a supporting surface 104 of the edge ring 100 so that the edge ring 100 extends partially below the substrate 102. Thermal energy 110 may be directed to a bottom surface of the substrate 102 below the substrate 102 and the edge ring 100 to heat the substrate 102, for example using heaters embedded in the substrate supporting structure. Plasma 108 and/or a second heat source may be directed to a top surface of the substrate 102 from above the edge ring 100 to further heat the substrate 102.

Conventional edge rings 100, as shown in FIG. 1, can sometimes become too hot, result in warping of the edge ring 100. Warping of the edge ring 100 results in a decrease in tool uptime should the edge ring 100 require replacement, and an increase in particle generation.

Thus, there is a need for an improved edge ring.

SUMMARY

Embodiments described herein generally relate to an edge ring for use in a substrate processing chamber. The edge ring has an annular body. Disposed within the annular body of the edge ring is a plurality of thermal breaks. The plurality of thermal breaks is disposed perpendicular to a center line of the annular body.

In another embodiment, a method for fabricating an edge ring is described herein. The method includes forming an annular body and forming a plurality of thermal breaks layers within the annular body. The plurality of thermal breaks is perpendicular to a centerline of the annular body. Each thermal break is interleaved within material comprising an annular body of the edge ring.

In yet another embodiment, a processing chamber is disclosed herein. The processing chamber includes a substrate support member and an edge ring. The substrate support member is configured to support a substrate. The edge ring is supported by the substrate support member. The edge ring is configured to extend below the substrate supported by the substrate support member. The edge ring includes an annular body and a plurality of thermal breaks disposed within the annular body. The thermal breaks are disposed perpendicular to a center line of the annular body of the edge ring.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
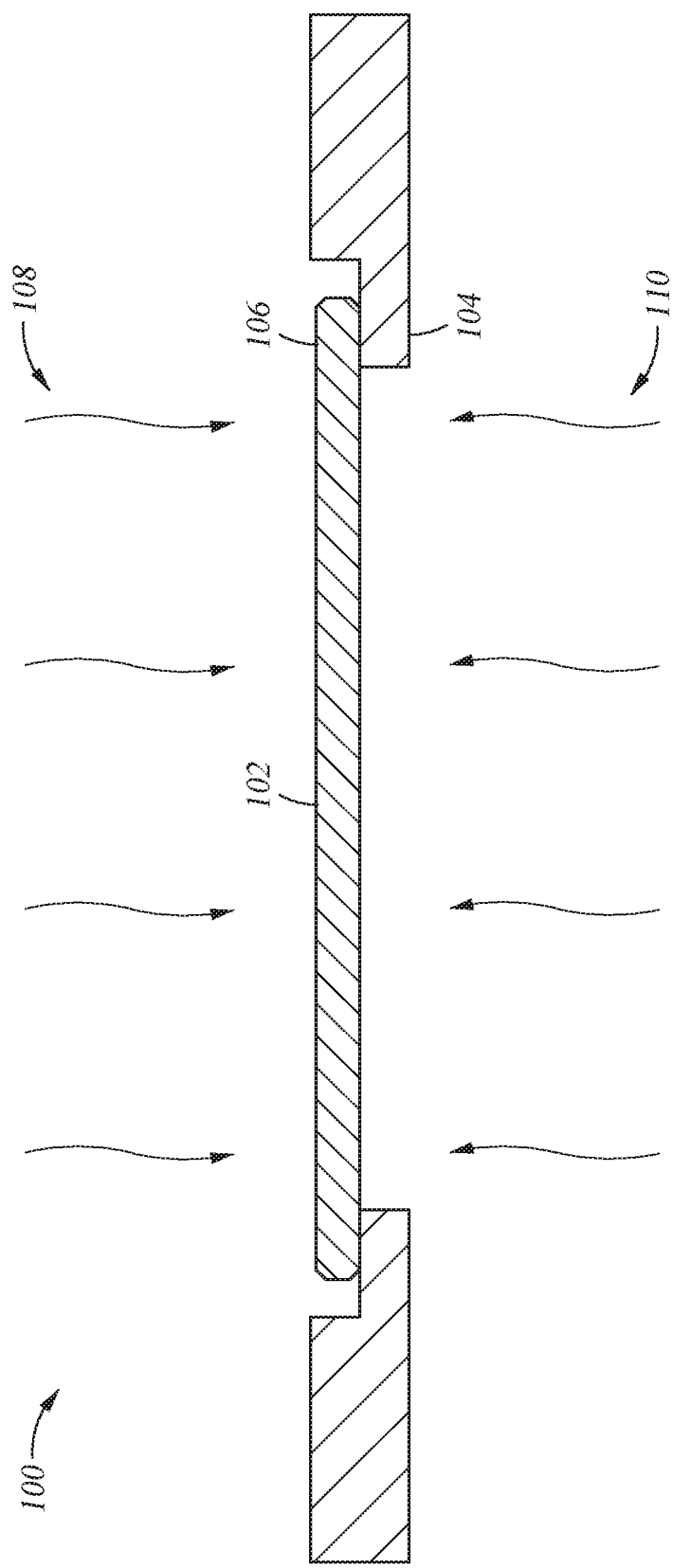
FIG. 1 schematically illustrates a sectional view of a conventional edge ring used in a thermal processing chamber.
Figure 2:
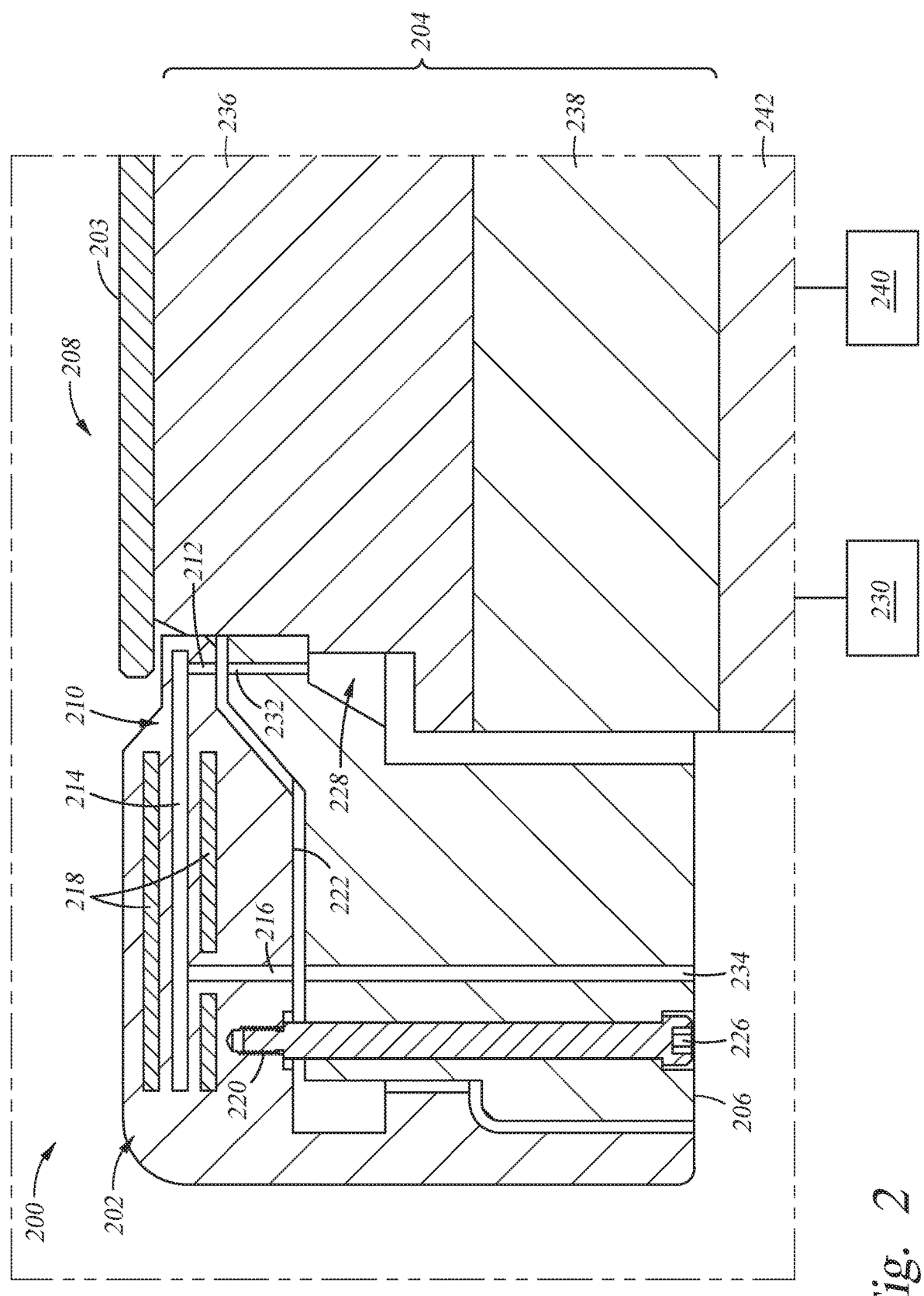
FIG. 2 schematically illustrates a partial sectional view of a thermal processing chamber with an improved edge ring, according to one embodiment.

FIG. 2 illustrates a side view of a processing chamber 200 having an edge ring 202. The processing chamber 200 includes a substrate support member 208 and a base 242. The substrate support member 208 is coupled to the base 242. The substrate support member 208 includes a support assembly 204. The support assembly 204 may be an electrostatic chuck assembly, a heater, a vacuum chuck assembly, or other substrate support platform.

A purge ring 206 and the edge ring 202 are supported on the substrate support member 208. The edge ring 202 is configured to extend below a substrate 203 disposed on the support assembly 204 during processing. The edge ring 202 may further include a plurality of thermal breaks 218, and may also include one or more of a threaded insert 220, and a gas distribution system 210.

The gas distribution system 210 includes a gas passageway 214, a gas inlet 212, and a gas outlet 216. The threaded insert 220 is located on a bottom surface 222 of the edge ring 202 that faces the purge ring 206. The threaded insert 220 is configured to receive a fastener 226, such that the fastener 226 couples the purge ring 206 to the edge ring 202. The threaded insert 220 is made of a material such that the threaded insert 220 can withstand the high internal crushing and shear stress generated during the heating process without becoming inseparable from the fastener 226. The edge ring 202 with threaded insert 220 and fastener 226 may also be an integral part of the edge ring 202, which may be machined out or 3D printed. The integral threaded insert 220 and fastener 226 may act as a centering feature for the substrate.

The gas inlet 212, the gas outlet 216, and the gas passageway 214 are disposed within the edge ring 202. The gas passageway 214 is in fluid communication with both the gas inlet 212 and the gas outlet 216. The edge ring 202 is described with more detail in FIG. 3.

The purge ring 206 is substantially annular in shape, which together with the support assembly 204, bounds an inner cavity 228. The inner cavity 228 is connected to a gas supply 230, for example, by conduits (not shown) routed through the support assembly 204. During processing, a purge gas is flowed into the inner cavity 228. The purge gas in the inner cavity 228 flows through gas outlets 232 disposed near the inside perimeter of the purge ring 206. The gas outlets 232 exist on a top surface of the purge ring 206 that faces the edge ring 202. The gas outlets 232 are in fluid communication with the gas inlet 212 of the edge ring 202. Thus, the purge gas exiting the gas outlet 232 is supplied into the gas passageway 214 of the edge ring 202 via the gas inlet 212. The purge ring 206 further includes an exhaust conduit 234. The exhaust conduit 234 of the purge ring 206 is in fluid communication with the gas outlet 216 of the edge ring 202, such that gas exiting the gas passageway 214 of the edge ring 202 through the gas outlet 216 can flow through the exhaust conduit 234 of the purge ring 206 and be routed out of the processing chamber 200.

The support assembly 204 supports the substrate 203 during processing. The support assembly 204 is coupled with the base 242. The support assembly 204 further includes an electrostatic chuck 236 and a cooling plate 238. The cooling plate 238 is disposed on the base 242. The cooling plate 238 may include a plurality of cooling channels (not shown) for circulating coolant therethrough. The cooling plate 238 may be engaged to the electrostatic chuck 236 by an adhesive or any suitable engagement mechanism. The bottom of the cooling plate 238 may be coated with a thermal barrier coating to reduce thermal cross talk between the cooling plate 238 and the electrostatic chuck 236.

The electrostatic chuck 236 may further include one or more heaters (not shown). The one or more heaters may be coupled to one or more heating power supplies 240. The one or more heaters may be independently controllable. The one or more heaters enable the electrostatic chuck 236 to heat the substrate 203 from the bottom surface of the substrate 203 to a desired temperature, for example, a temperature of about 300 degrees Celsius. To prevent excessive heating of the edge ring 202 by the high temperature of the electrostatic chuck 236, the edge ring 202 may include one or more heat control mechanisms, such as thermal breaks 218, a thermal barrier coating, and gas distribution system 210.

Figure 3:
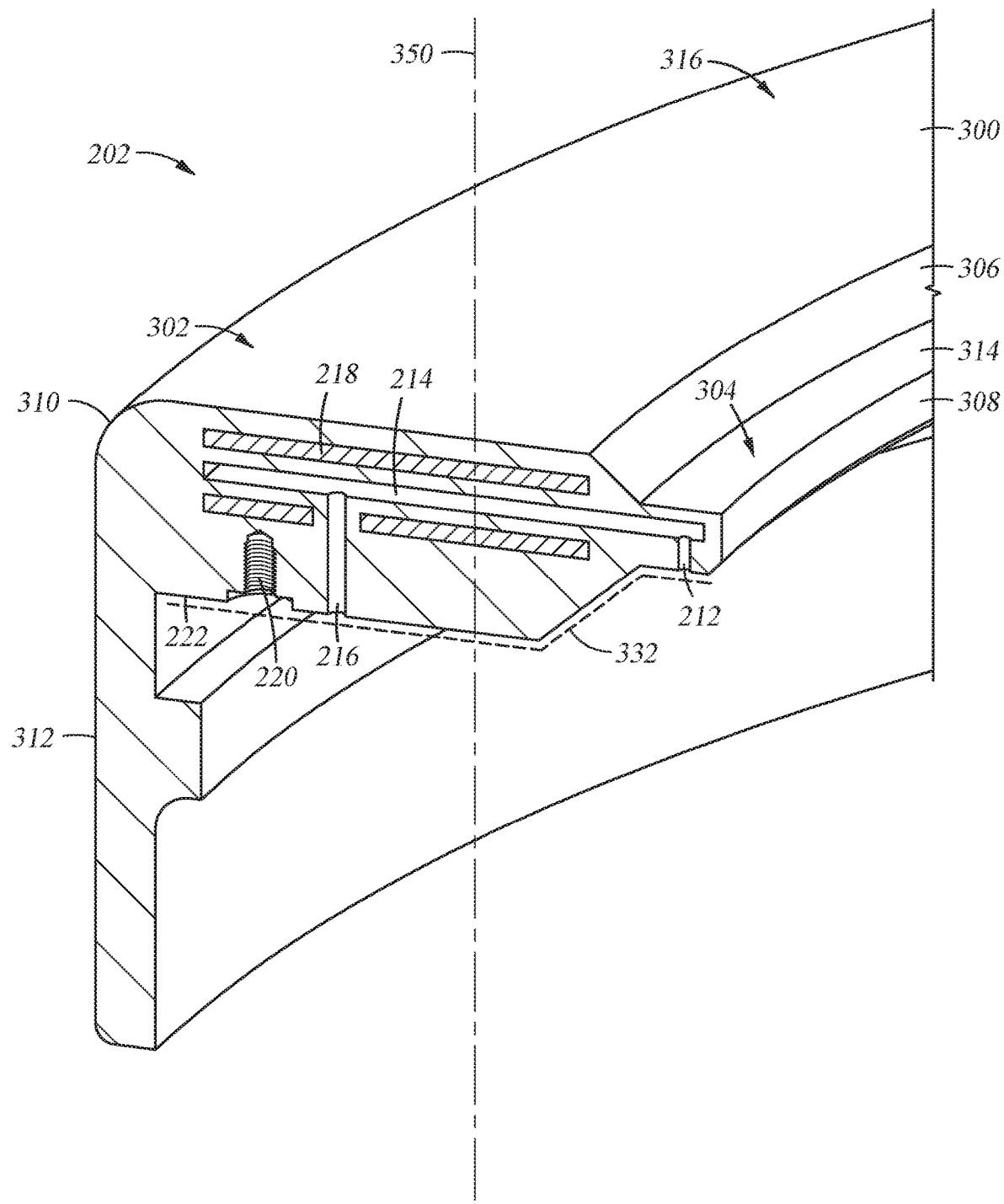
FIG. 3 is an enlarged cross-sectional view of the improved edge ring of FIG. 2, according to one embodiment.

FIG. 3 illustrates a partial enlarged view of the edge ring 202 illustrating the one or more heat control mechanisms. The edge ring 202 has an annular body 300. The annular body 300 may include an outer band 302 and an inner band 304. The inner band 304 is configured to extend partially below an edge of the substrate (not shown) disposed on the substrate support member (as shown in FIG. 2) during processing. The outer band 302 includes an inner wall 306 that at least partially surrounds a periphery of the substrate. The outer band 302 and inner band 304 are concentric about the centerline of the annular body 300. The inner wall 306 of the outer band 302 is connected to a ledge 314 of the inner band 304. The ledge 314 of the inner band 304 extends inward from the inner wall 306 of the outer band 302 and terminates at a first annular sidewall 308. The annular body 300 of the edge ring 202 may further comprise a second annular wall 310 that extends downwards to form an outer wall 312. In one example, the outer wall 312 may extend down the length of the purge ring 206 of FIG. 2.

The inner band 304 of the edge ring 202 extends radially inwards towards the central axis of the annular body 300 from the inner wall 306 of the outer band 302 to form the ledge 314 which extends below the substrate. The ledge 314 is below and parallel to a top surface 316 of the outer band 302. The ledge 314 of the inner band 304 is sized according to the size of the substrate and allows for thermal expansion of the substrate. The ledge 314 of the inner band 304 is sized to extend below a periphery of the substrate. The inner band 304 can extend a sufficient distance beneath the substrate, such as from about 0.1 cm to about 0.5 cm to protect the support assembly 204.

Figure 4:
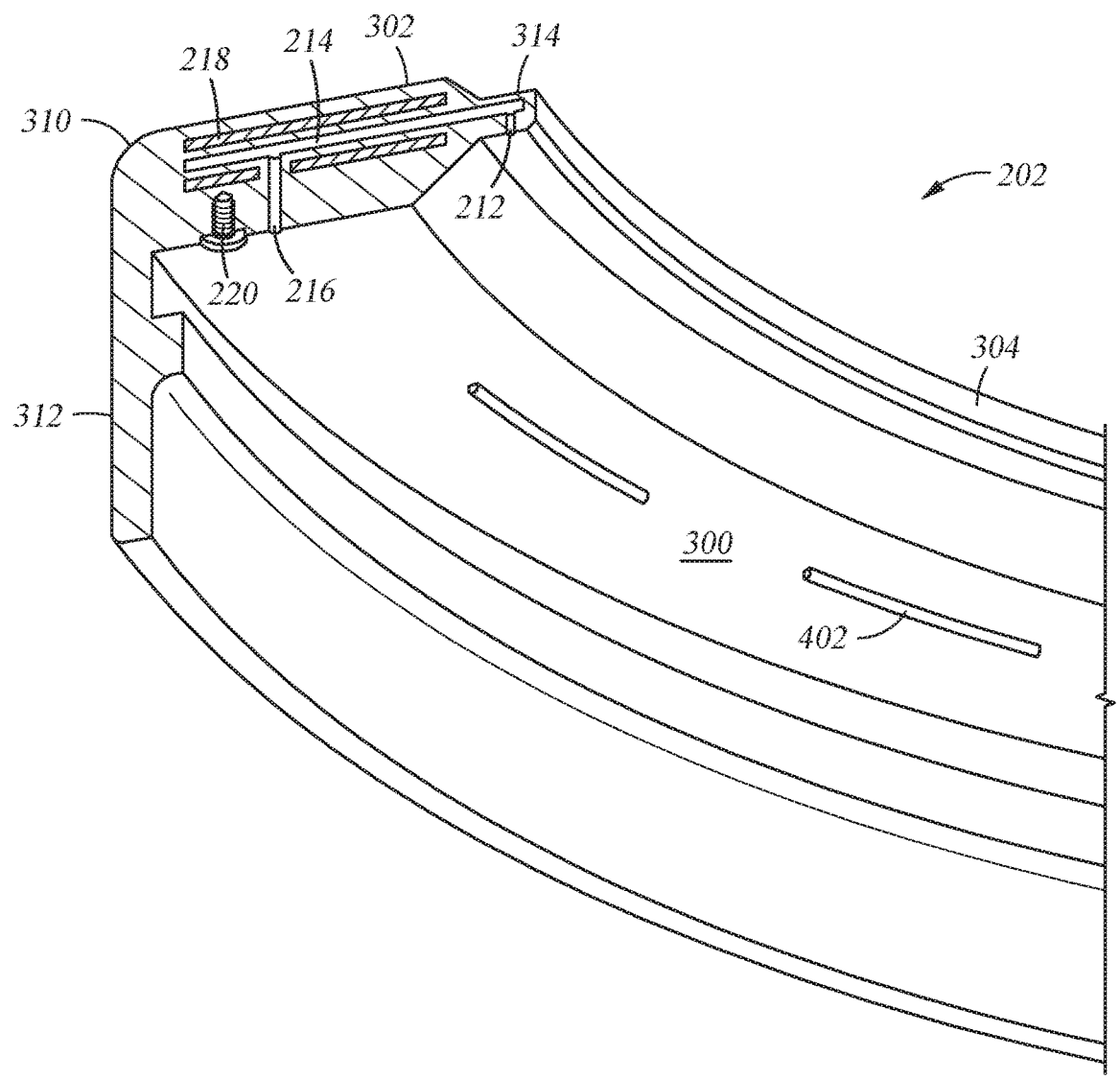
FIG. 4 is a partial cross-sectional view of another embodiment of an edge ring, according to one embodiment.

FIG. 4 illustrates one embodiment of the edge ring 202. The annular body 300 of the edge ring 202 may include a plurality of fins 402. The fins 402 are configured to increase the surface area of the structure by increasing the exposed surface of the edge ring 202. By increasing the exposed surface of the edge ring 202, the thermal conductivity is increased, thus reducing the temperature gradient and ultimately reducing deformation of the edge ring 202. Additionally, the fins 402 may be configured such that a purge gas can flow in the area between the edge ring 202 and the electrostatic chuck 236 in addition to, or in lieu of, the purge gas flowing through the gas passageway 214.

In one example, the fin 402 is a continuous circular wall concentric with the outer band 302 and the inner band 304. The fin 402 may be positioned between the outer band 302 and the inner band 304. The fin 402 has a radius from the central axis. The radius of the fin 402 may be designed to achieve the radial temperature gradient or temperature profile of the edge ring 202 and thus, reduce deformation of the edge ring 202 during heating. In another example (as shown), the annular body 300 includes a plurality of fins 402 forming a non-continuous circular wall concentric with the outer band 302 and the inner band 304.

Referring back to FIG. 3, the annular body 300 further includes the thermal breaks 218. The thermal breaks 218 are disposed within the annular body 300 of the edge ring 202, perpendicular to a center line 350 of the annular body 300. The thermal breaks 218 extend through the length of the annular body 300 beneath the top surface 316 of the outer band 302. The thermal breaks 218 are composed of a material having a different coefficient of thermal conductivity relative to the material comprising the annular body 300. For example, the thermal breaks 218 may be comprised of a thermally conductive material, such as, graphite. When the substrate is heated by the electrostatic chuck 236, the plasma source, or both, the edge ring 202 may rise in temperature. The thermal breaks 218 are configured to disperse the heat laterally (radially) throughout the edge ring 202 while inhibiting axial heat transfer, which functions to substantially prevent overheating and warpage of the edge ring 202. Because of the reduced and more uniform heating of the edge ring 202, the edge ring 202 is less susceptible to warpage and particle generation.

In another example, the annular body 300 of the edge ring 202 may alternatively or additional include the gas distribution system 210 as described above. The gas distribution system 210 may work with the thermal breaks 218 to reduce the heating of the edge ring 202. As described above, the gas distribution system 210 allows a purge gas to flow through edge ring 202, thereby transferring heat from the edge ring 202. The purge gas may be an inert gas, for example, nitrogen. As the purge gas flows through the gas passageway 214, the purge gas may cool the annular body 300 of the edge ring 202 to compensate for heating of the edge ring 202 by the chamber processes. When used with the thermal breaks 218, the gas passageway 214 of the gas distribution system 210 may be disposed parallel with the thermal breaks 218 to enhance temperature uniformity.

In another embodiment, the thermal breaks 218 and the gas distribution system 210 may extend down the length of the outer wall 312 of the edge ring 202. The thermal breaks 218 and the gas distribution system 210 may help cool the outer wall 312 of the edge ring 202, which protects the periphery of the purge ring 206 from being heated by the chamber environment.

In addition to, or alternative to, one or both of the thermal breaks 218 and gas distribution system 210, a thermal barrier coating 332 may be disposed on one or more surfaces 316, 222 of the edge ring 202. For example, the thermal barrier coating 332 may be disposed on a bottom surface 222 of the edge ring 202. The thermal barrier coating 332 may also extend down the length of the outer wall 312 of the edge ring 202. The thermal barrier coating 332 provides additional protection for the edge ring 202 from thermal energy emitted from the electrostatic chuck 236. The thermal barrier coating 332 thus enhances temperature control and/or uniformity across the substrate and the edge ring 202. The thermal barrier coating 332 is made from a material having a lower coefficient of thermal conductivity relative to the material of the annular body 300, such as, for example, zirconium oxide, diamond like carbon (DLC), quartz, or yttrium stabilized zirconium oxide. A bonding layer (not shown) may be placed in-between the thermal barrier coating 332 and the bottom surface 222 of the edge ring 202. In one example, the bonding layers may be 0.5 to 20 microns thick. In another example, the thermal barrier coating 332 may be 100 to 200 microns thick.

The top surface 316 of the edge ring 202 may optionally be bead blasted. The top surface 316 of the edge ring 202 is bead blasted to increase the roughness of the surface. The roughened surface of the edge ring 202 reduces arcing within the processing chamber 200 and contributes to uniform deposition on the substrate.

The edge ring 202 may be formed from a suitable material according to the material of the substrate being processed. In one example, the edge ring 202 may be formed from a material having a similar thermal capacity as the material of the substrate. In another example, the edge ring 202 may be formed from a silicon carbide material for processing a silicon substrate.

In one embodiment, edge ring 202 may be manufactured using a 3D printing process. In the 3D printing process, thin layers are progressively deposited and fused until the edge ring 202 is complete. Each layer is applied by a nozzle of a 3D printer in a pattern stored by a 3D drawing computer program that runs on a computer (not shown). The thermal breaks 218 in the edge ring 202 may be formed using the 3D printing process. For example, a layer comprising the annular body 300 of the edge ring 202 and a layer comprising the thermal break 218 could be fabricated in an uninterrupted operation by the 3D printer. The 3D printing approach reduces expense and time required for conventional edge ring manufacturing. The 3D printing approach also eliminates several conventional edge ring manufacturing steps, such as molding, casting, and machinating. Additionally, tight tolerances can be achieved due to layer-by-layer printing approach. One printing system can be used to manufacture a variety of different edge rings, with or without the thermal breaks 218, simply by changing the pattern stored in the 3D drawing computer program. The 3D printed parts may be subjected to post processing processes, such as hot isostatic pressing to minimize surface defects and porosity.

The edge ring 202 may alternatively be manufactured through a casting process or other forming process. During the casting process, the annular body 300 of the edge ring 202 is embedded with a thermally conductive material, i.e., the thermal breaks 218.

While the foregoing is directed to embodiments of the present disclosure, other and further embodiments of the disclosure may be devised without departing from the basic scope thereof, and the scope thereof is determined by the claims that follow.

What is claimed is:

1. A method for fabricating an edge ring embedded with a thermally conductive material, the method comprising:
   forming an annular body comprising a first material; and
   forming a plurality of thermal breaks comprising a second material having a higher coefficient of thermal conductivity relative to the first material, wherein
   each of the plurality of thermal breaks is encapsulated within the first material of the annular body, the plurality of thermal breaks is disposed perpendicular to a centerline of the annular body, and configured to disperse heat laterally throughout the edge ring while inhibiting axial heat transfer along the centerline.

2. The method of claim 1, wherein forming the annular body of the edge ring further comprises forming a gas distribution system within the annular body.

3. The method of claim 1 further comprising:
   depositing a coating on the annular body, the coating comprising a third material having a lower coefficient of thermal conductivity relative to the first material.

4. The method of claim 3, wherein the third material of the coating is a material selected from the group consisting of zirconium oxide, carbon in diamond form, and quartz.

5. The method of claim 3, wherein the third material of the coating comprises yttrium stabilized zirconium oxide.

6. The method of claim 3, wherein the coating has a thickness between 100 to 200 microns.

7. The method of claim 1, wherein forming a plurality of thermal breaks within the annular body comprises:
   3D printing the plurality of thermal breaks within the annular body.

8. The method of claim 7, further comprising:
   hot isostatic pressing the edge ring.

9. The method of claim 1, further comprising:
   installing a threaded insert in the annular body.

10. The method of claim 1, further comprising:
    forming a plurality of fins integral with a bottom surface of the annular body.

11. A method of processing a substrate in a processing chamber, comprising:
    placing the substrate on an edge ring supported by a substrate support member within the processing chamber, the edge ring comprising an annular body and a plurality of thermal breaks;

heating the substrate by a heater embedded in the substrate support member; and dispersing heat laterally throughout the edge ring while inhibiting axial heat transfer along a centerline of the annular body, wherein
the annular body comprises a first material,
the plurality of thermal breaks comprise a second material having a higher coefficient of thermal conductivity relative to the first material, and
the plurality of thermal breaks are encapsulated within the first material and disposed perpendicular to the centerline of the annular body.

12. The method of claim 11, wherein the edge ring further comprises a gas distribution system disposed within the annular body.

13. The method of claim 11, wherein the edge ring further comprises:
a coating comprising a third material having a lower coefficient of thermal conductivity relative to the first material.

\* \* \* \* \*